US008558134B2

(12) United States Patent  
Hirayama

(10) Patent No.: US 8,558,134 B2  
(45) Date of Patent: Oct. 15, 2013

(54) PLASMA PROCESSING APPARATUS AND PLASMA PROCESSING METHOD

(75) Inventor: Yusuke Hirayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 803 days.

(21) Appl. No.: 12/410,672

(22) Filed: Mar. 25, 2009

(65) Prior Publication Data

US 2009/0242520 A1 Oct. 1, 2009

Related U.S. Application Data

(60) Provisional application No. 61/055,541, filed on May 23, 2008.

(30) Foreign Application Priority Data

Mar. 26, 2008 (JP) ................................. 2008-080147

(51) Int. Cl.  
*B23K 9/02* (2006.01)

(52) U.S. Cl.  
USPC ..................................... 219/121.41; 118/724

(58) Field of Classification Search  
USPC ............... 219/121.41, 121.4, 121.43, 121.36, 219/121.5, 121.51; 216/67, 71; 118/723 E, 118/723 ER, 723 I; 156/345.33, 345.38  
See application file for complete search history.

(56) References Cited

U.S. PATENT DOCUMENTS

| 2004/0033692 | A1* | 2/2004 | Yamazaki et al. | 438/689 |
| 2006/0016559 | A1* | 1/2006 | Kobayashi et al. | 156/345.34 |
| 2006/0096540 | A1* | 5/2006 | Choi | 118/724 |
| 2006/0243389 | A1* | 11/2006 | Hirayama et al. | 156/345.3 |
| 2006/0289296 | A1* | 12/2006 | Maruyama et al. | 204/192.32 |
| 2007/0224828 | A1* | 9/2007 | Kushibiki et al. | 438/706 |
| 2007/0284340 | A1* | 12/2007 | Jorgensen | 219/121.5 |

FOREIGN PATENT DOCUMENTS

| JP | 3184682 B2 | 4/2001 |
| JP | 2004-281519 A | 10/2004 |

* cited by examiner

*Primary Examiner* — Henry Yuen  
*Assistant Examiner* — Phuong Nguyen  
(74) *Attorney, Agent, or Firm* — Rothwell, Figg, Ernst & Manbeck, P.C.

(57) ABSTRACT

A plasma processing apparatus includes a local plasma generator, provided to face a mounting table for mounting thereon a substrate to be processed in an airtight processing chamber, for allowing a plasma to locally react on the substrate to be processed; and a moving unit for moving the local plasma generator. The local plasma generator has an offset gas discharge mechanism for discharging an offset gas which offsets reaction of a plasma of a gas discharged from an inside of the local plasma generator.

16 Claims, 5 Drawing Sheets

PLASMA PROCESSING APPARATUS AND PLASMA PROCESSING METHOD

FIELD OF THE INVENTION

The present invention relates to a plasma processing apparatus used for etching a substrate to be processed; and, more particularly, to a local plasma etching apparatus for selectively etching a desired portion of a substrate to be processed while preventing the remaining portion from being affected by the etching.

BACKGROUND OF THE INVENTION

In general, a plasma etching apparatus is used for simultaneously etching an entire surface of a substrate to be processed by discharging an etching gas to the entire substrate from a plurality of gas discharge openings formed in parallel plate electrodes disposed above the substrate. However, recently, a demand for a local etching technique for locally etching a desired portion of a substrate is growing, and study and development thereof have been progressed.

Scaling up of a diameter of the substrate is also one of the reasons for causing the above demand. When the diameter of the substrate is scaled up, equipment costs increase. Further, it is difficult to uniformly supply a plasma on the entire substrate and maintain uniformity of the etching process. The fluidity of a reactant gas is one of the reasons that cause the non-uniformity. That is, a reactant gas is exhausted from a peripheral portion of the substrate, so that a flow speed of the reactant gas discharged from gas discharge openings increases as the reactant gas flows from the central portion of the substrate toward the peripheral portion of the substrate. Accordingly, it is difficult to uniformize the flow speed of the reactant gas on the entire substrate. The non-uniformity of the flow speed leads to non-uniformity in a density of the plasma generated on the substrate. Such non-uniformity increases as the diameter of the substrate increases.

In order to cope with the scaling up of the diameter of the substrate, there is suggested a method employing a local plasma to achieve a uniform etching process. For example, the following Patent Document 1 discloses a plasma processing apparatus and method in which a local plasma is generated and moved properly above an object to be processed, whereby the entire processing region of the object can be subjected to substantially constant plasma states.

[Patent Document 1] Japanese Patent Publication No. 3184682

However, the plasma processing apparatus of Patent Document 1 has following drawbacks. FIG. 5 shows a conventional plasma etching apparatus exemplified to explain the drawbacks thereof. As shown in FIG. 5, a pair of parallel plate electrodes 33a and 33b is provided inside a cover 28, and a first high frequency power is applied from an upper power supply 35 to the parallel plate electrodes 33a and 33b. The parallel plate electrodes 33a and 33b have therein gas channels, and a plurality of gas discharge openings 36 are formed in inner surfaces of the electrodes. A reactant gas is introduced from an inlet line 37, and discharged from the gas discharge openings 36 to a space between the facing parallel plate electrodes 33a and 33b. Next, the reactant gas is converted into a plasma by the high frequency power, and supplied toward a substrate to be processed such as a silicon wafer or the like. The substrate 15 is maintained by an electrostatic chuck 16 disposed above a susceptor 2, and a second high frequency power is applied from a lower power supply 38 to the susceptor 2.

When the local etching is carried out by the above plasma processing apparatus, it is preferable to etch only a lower portion ("A" portion in the drawing) of the cover 28. However, the reactant gas is exhausted from the periphery of the cover 28 and detours the substrate 15. Subsequently, a peripheral portion ("B" portion of the drawing) of the cover 28 is also slightly etched.

The etching of the "B" portion is unstable in an amount or a range of the reaction. Thus, when an entire substrate is etched by scanning the above plasma processing apparatus, non-uniformity occurs, which needs to be prevented. That is, there is required a local etching unit for etching only a desired portion ("A" portion) without etching other portions (while preventing other portions from being affected by the etching).

SUMMARY OF THE INVENTION

In view of the above, the present invention provides a plasma processing apparatus for selectively etching a desired portion of a substrate to be processed while preventing other portions from being affected by the etching.

In accordance with an aspect of the present invention, there is provided a plasma processing apparatus including: a local plasma generator, provided to face a mounting table for mounting thereon a substrate to be processed in an airtight processing chamber, for allowing a plasma to locally react on the substrate to be processed; and a moving unit for moving the local plasma generator.

The local plasma generator includes an offset gas discharge mechanism for discharging an offset gas which offsets reaction of a plasma of a gas discharged from an inside of the local plasma generator.

The plasma of the gas may be a plasma of an etching gas, and the offset gas may be a deposition gas.

The plasma processing apparatus may further include a mechanism for maintaining a pressure in the local plasma generator to be higher than a pressure in the processing chamber. Accordingly, it is possible to make a small amount of the deposition gas to be introduced into the local plasma generator.

The offset gas discharge mechanism preferably has a structure in which gas discharge lines spaced apart from each other at regular intervals are installed along an outer peripheral surface of the local plasma generator.

The gas discharge openings of the gas discharge lines may be provided at a position higher than a height of an opening end of the local plasma generator when seen from the substrate to be processed during plasma processing. Accordingly, it is possible to make a small amount of the deposition gas to be introduced into the local plasma generator.

The offset gas discharge mechanism may have a slit-shaped gas channel formed around an outer periphery surface of the local plasma generator. In this case, a gas discharge opening of the gas channel is preferably provided at a position higher than a height of an opening end of the local plasma generator when seen from the substrate to be processed during plasma processing. Accordingly, it is possible to make a small amount of the deposition gas to be introduced into the local plasma generator.

In accordance with another aspect of the present invention, there is provided a plasma processing method for plasma processing an entire surface of a substrate to be processed by repeatedly performing a process for allowing a plasma of a gas to locally react on the substrate until the entire surface of the substrate is processed by the plasma with the use of a local plasma generator disposed to face a mounting table for mounting thereon the substrate to be processed in an airtight processing chamber.

The method includes discharging an offset gas, which offsets reaction of the plasma, to a boundary region which surrounds a region through which the plasma is discharged from an inside of the local plasma generator into the processing chamber.

The plasma of the gas may be a plasma of an etching gas, and the offset gas may be a deposition gas.

The plasma processing may be performed while maintaining a pressure in the local plasma generator to be higher than a pressure in the processing chamber.

In accordance with the present invention, there can be provided a plasma processing apparatus for selectively etching a desired portion of a substrate to be processed while preventing other portions from being affected by the etching.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
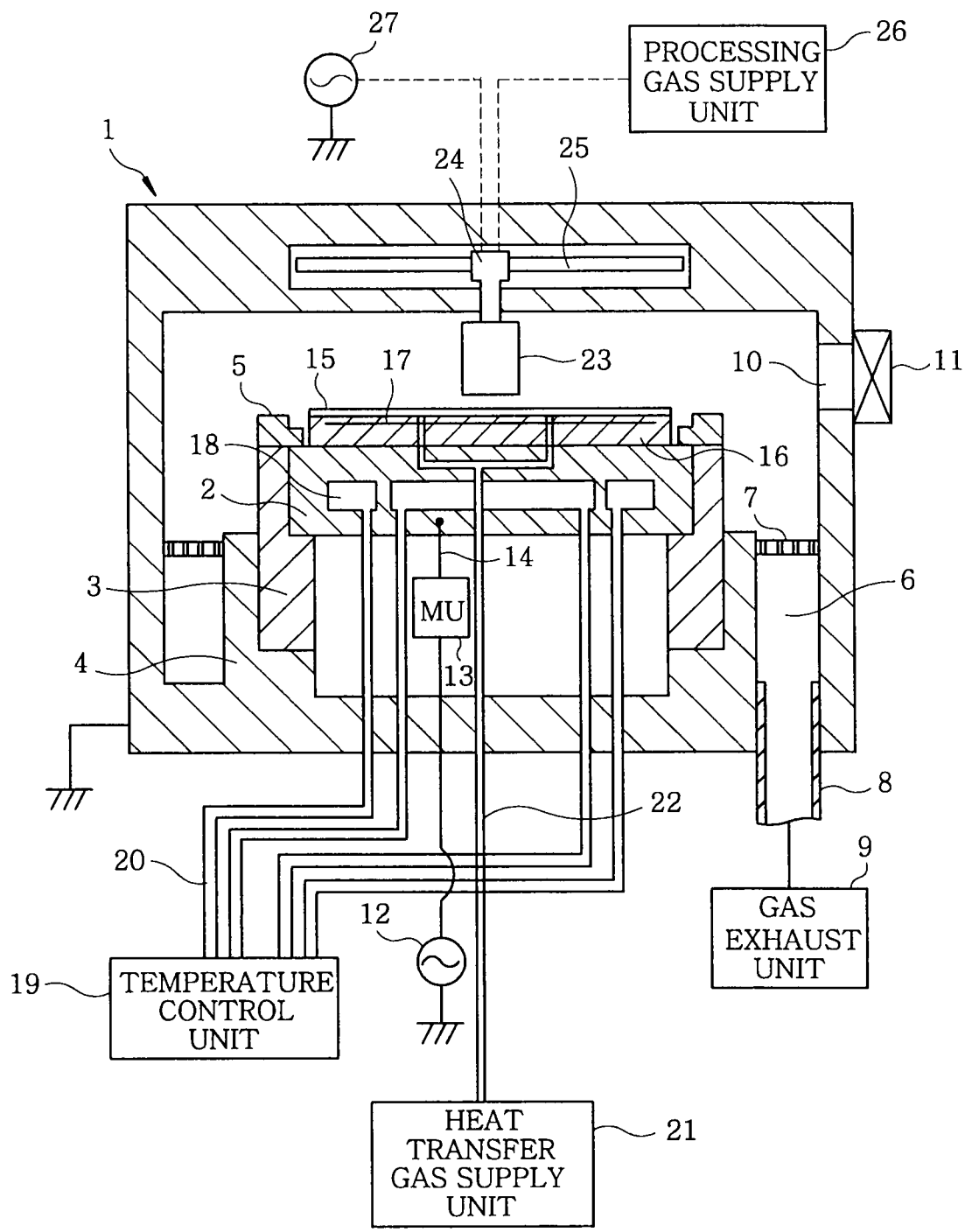
FIG. 1 is a schematic cross sectional view showing an example of a plasma processing apparatus used for implementing the present invention.

Hereinafter, an embodiment in which a plasma processing apparatus of the present invention is applied to a plasma etching apparatus will be described with reference to the accompanying drawings which form a part hereof. FIG. 1 shows a schematic configuration of the plasma processing apparatus used for implementing the present invention. Referring to FIG. 1, a cylindrical chamber 1 is made of, e.g., aluminum, stainless steel or the like, and has an inner space that can be airtightly sealed. The chamber 1 is grounded to the earth.

Provided in the chamber 1 is a mounting table (hereinafter, referred to as a "susceptor") 2 for mounting thereon a substrate to be processed, e.g., a semiconductor wafer 15. The susceptor 2 illustrated in FIG. 1 is used as a heat exchanging plate for controlling a temperature of the semiconductor wafer 15 contacted there with by exchanging heat. The susceptor 2 is made of a material of high electrical conductivity and high thermal conductivity such as aluminum or the like, and also serves as a lower electrode.

The susceptor 2 is supported by a cylindrical sustaining member 3 made of an insulating material such as ceramic or the like. The cylindrical sustaining member 3 is supported by a cylindrical supporting portion 4 of the chamber 1. A focus ring 5 made of quartz or the like is disposed on a top surface of the cylindrical sustaining member 3 to surround a top surface of the susceptor 2 in an annular shape.

An annular gas exhaust passageway 6 is formed between the sidewall of the chamber 1 and the cylindrical supporting portion 4. An annular baffle plate 7 is provided at the entrance or in the middle of the gas exhaust passageway 6. A bottom portion of the gas exhaust passageway 6 is connected to a gas exhaust unit 9 via a gas exhaust line 8. The gas exhaust unit 9 has a vacuum pump and reduces a pressure of a space in the chamber 1 to a predetermined vacuum level. Attached on the sidewall of the chamber 1 is a gate valve 11 for opening and closing a loading/unloading port 10 of the semiconductor wafer W.

A lower high frequency power supply 12 for plasma generation is electrically connected to the susceptor 2 via a matching unit (MU) 13 and a power supply rod 14. The lower high frequency power supply 12 supplies a power having a low frequency of, e.g., about 2 MHz, to the susceptor 2 serving as the lower electrode.

On a ceiling portion of the chamber 1, a local plasma generator 23 is attached to a guide rail 25 via an attaching device 24 to be movable in horizontal and vertical directions (XY directions) with respect to the semiconductor wafer 15.

Further, an etching gas is supplied from a processing gas supply unit 26 to the local plasma generator 23. Meanwhile, a high frequency power of, e.g., about 13.56 MHz, is supplied from an upper high frequency power supply 27, thereby converting the etching gas into a plasma. A structure of the local plasma generator 23 will be described later in detail.

An electrostatic chuck 16 for holding the semiconductor wafer W by an electrostatic attraction force is installed on the top surface of the susceptor 2. The electrostatic chuck 16 is made of a dielectric material such as ceramic or the like. An internal electrode 17 which is a conductor is embedded in the electrostatic chuck 16. The internal electrode 17 is formed of a conductive film made of, e.g., copper, tungsten or the like.

A DC power supply (not shown) for supplying a high voltage, e.g., 2500 V, 3000 V or the like, is electrically connected to the internal electrode 17 via a switch (not shown). The semiconductor wafer 15 is attracted and held to the electrostatic chuck 16 by Coulomb force or Johnson-Rahbeck force generated by a DC voltage applied to the internal electrode 17.

A heat transfer medium (fluid) path 18 is provided inside the susceptor 2. A heat transfer medium of a predetermined temperature, e.g., heating water or cooling water, is supplied into the heat transfer medium path 18 from a temperature control unit 19 via lines 20 to be circulated therein.

A heat transfer gas, e.g., He gas, from a heat transfer gas supply unit 21 is supplied between the electrostatic chuck 16 and a backside of the semiconductor wafer 15 via a gas supply line 22 in order to improve thermal conductivity between the electrostatic chuck 16, i.e., the susceptor 2, and the semiconductor wafer 15.

Figure 2A:
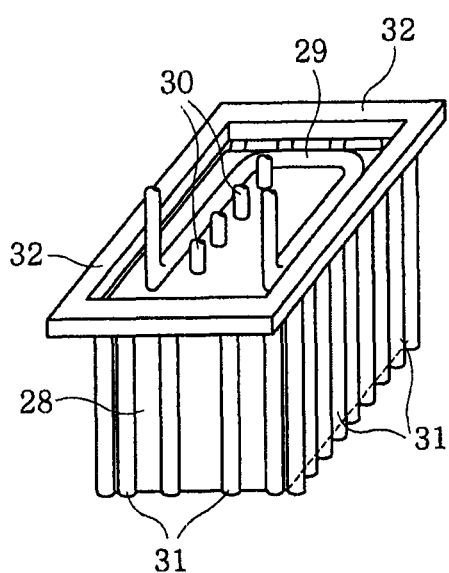
FIGS. 2A to 2D describe a structure of a local plasma generator in accordance with a first embodiment of the present invention.
Figure 2B:
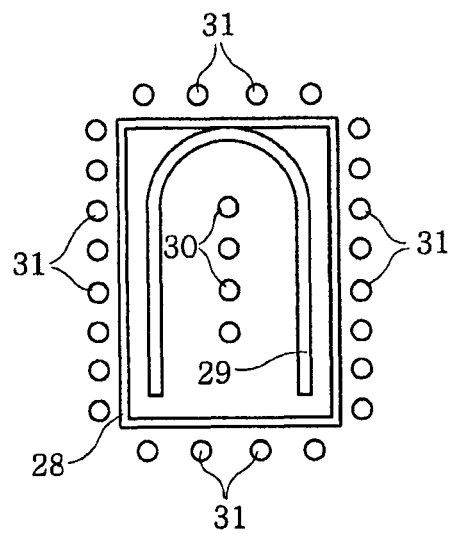
Figure 2C:
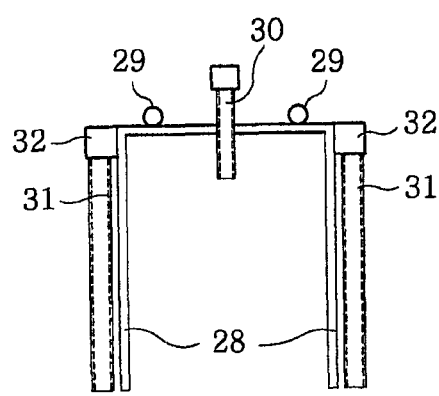
Figure 2D:
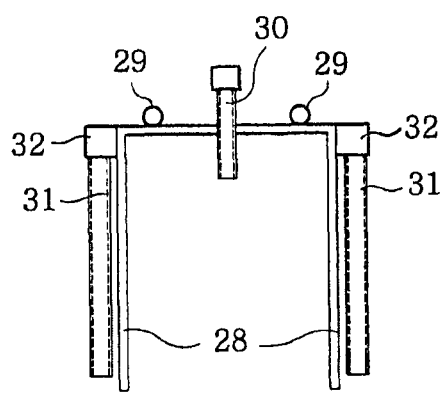

FIGS. 2A to 2D illustrate a structure of a local plasma generator in accordance with a first embodiment of the present invention. FIG. 2A is an exterior perspective view; FIG. 2B is a horizontal cross sectional view; FIG. 2C is a vertical cross sectional view; and FIG. 2D is a vertical cross sectional view obtained when a length of deposition gas supply lines 31 is shortened compared to a length of a cover 28.

This local plasma generator is configured as a plasma generating device of an inductively coupled plasma (ICP) type, and has a structure in which a horseshoe-shaped coil 29 is disposed on a top surface of a rectangular box-shaped cover 28.

A reactant gas (hereinafter, referred to as an "etching gas") is introduced into an inner space covered by the cover 28 from a plurality of reactant gas inlet lines 30 spaced apart from each other at regular intervals near a center of a ceiling portion of the cover 28. Thereafter, the introduced etching gas is converted into a plasma by a high frequency power applied to the coil 29.

A bottom of the cover 28 is formed as an opening, and an opening area thereof is smaller than that of the semiconductor wafer 15. The plasma etching gas generated in the inner space of the cover 28 is discharged to the semiconductor wafer 15, thereby etching the surface of the semiconductor wafer 15 within the range of the opening.

Here, a plurality of deposition gas supply lines 31 is arranged outside the cover 28. In the present embodiment, the deposition gas supply lines 31 are provided upright along the side surface of the cover 28.

The deposition gas supply lines 31 are spaced apart from each other at regular intervals along a substantially entire periphery of an outer surface of the cover 28. Each of the deposition gas supply lines 31 has a top portion connected to a deposition gas supply duct 32 and an opened bottom portion. That is, the deposition gas that has not converted into the plasma can be discharged from the entire periphery of the opening toward the semiconductor wafer 15.

The present invention is characterized in that the deposition gas flows in a curtain shape at the outer periphery of the opening of the local plasma generator 23. Some of the deposition gas is mixed with the plasmatized etching gas discharged from the opening, and thus is converted into a plasma by the effect of the plasma gas.

The plasmitized deposition gas is deposited on the surface of the semiconductor wafer 15, and the etching gas having an etching effect also reaches the semiconductor wafer 15. Therefore, the plasma gas and the deposition gas are mixed in a region under the cover 28, i.e., in a boundary region between an etching target region and a non-etching target region. Accordingly, the etching effect by the plasma gas and the deposition effect by the deposition gas are balanced or offseted. As a result, only a desired portion is selectively etched, and the remaining portion is not etched.

The region where the plasma of etching gas and the plasma of deposition gas are mixed with each other should not affect the etching process performed in an inner region of the opening. To do so, lines of the deposition gas are preferably provided outside the cover 28. Further, it is preferable to maintain an inner pressure P1 of the local plasma generator 23 at a level higher than an outer pressure P2 thereof, i.e., a pressure of the chamber 1.

Since the reactant gas is exhausted from the periphery of the cover 28, the inner pressure P1 of the plasma generator can be easily maintained at a level higher than the outer pressure P2 thereof by reducing a distance d between the bottom of the cover 28 and the surface of the semiconductor wafer 15. In general, the distance d preferably ranges from a few mm to about 20 mm. Moreover, the inner pressure P1 and the outer pressure P2 are preferably maintained at several tens of Torr and several Torr, respectively.

In order to properly balance the etching effect by the plasma of etching gas and the deposition effect by the plasma of deposition gas, the conditions of the deposition gas, e.g., a dilution rate, a flow rate of the deposition gas, a difference between an inner pressure P1 and an outer pressure P2 of the local plasma generator 23 and the like, should be properly controlled.

Accordingly, only the surface of the semiconductor wafer 15 which corresponds to the opening region can be etched while preventing the other surface region of the semiconductor wafer 15 from being affected by the etching. Besides, the deposition gas is not converted into the plasma without being mixed with the plasma gas, so that deposits are hardly formed on the semiconductor wafer 15.

Meanwhile, when the deposition gas enters the local plasma generator 23 with some reasons, the deposition gas is converted into a plasma and reacts with the etching gas in the local plasma generator 23, thereby adversely affecting the etching process. In order to prevent this, as shown in FIG. 2D, a discharge opening of the deposition gas is provided at the portion upper than the bottom of the cover 28 when seen from the surface of the semiconductor wafer 15.

Figure 3A:
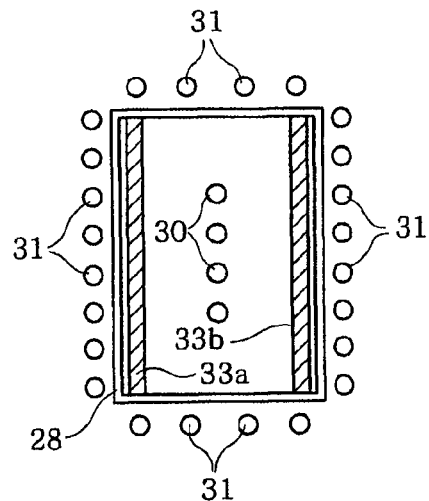
FIGS. 3A to 3C illustrate a structure of a local plasma generator in accordance with a second embodiment of the present invention.
Figure 3B:
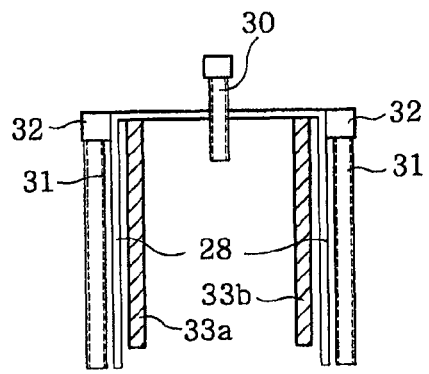
Figure 3C:
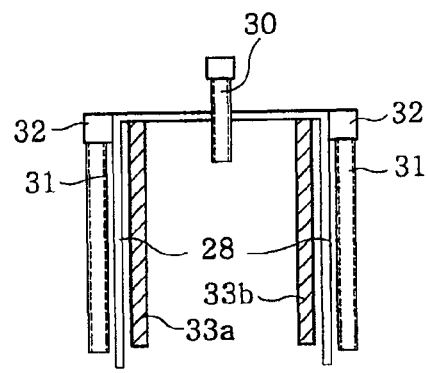

FIGS. 3A to 3C illustrate a structure of a local plasma generator in accordance with a second embodiment of the present invention. FIG. 3A is a horizontal cross sectional view; FIG. 3B is a vertical cross sectional view; and FIG. 3C is a vertical cross sectional view in which a length of the deposition gas supply lines 31 is shortened compared to a length of the cover 28.

This local plasma generator is configured as a plasma generating device of a capacitively coupled plasma (CCP) type, and has a structure in which a pair of parallel plate electrodes 33a and 33b is disposed inside a rectangular box-shaped cover 28. The second embodiment is different from the first embodiment of FIG. 2 in that the parallel plate electrodes 33a and 33b are provided, but is the same as the first embodiment of FIG. 2 in that an etching gas is introduced from a plurality of reactant gas inlet lines 30 disposed near the center of the ceiling portion of the cover 28.

The etching gas introduced into the cover 28 is converted into a plasma by a high frequency power applied to the electrodes 33a and 33b. As in the first embodiment, the surface of the semiconductor wafer 15 which corresponds to the space covered with the cover 28 is locally etched by the etching gas.

Further, the second embodiment is the same as the first embodiment in that a plurality of deposition gas supply lines 31 spaced apart from each other at regular intervals are provided upright along the side surface of the cover 28, and also in that the deposition gas that has not converted into the plasma is discharged from a substantially entire outer periphery of the opening toward the semiconductor wafer 15.

In the local plasma generator 23 of FIG. 3, as well as in that of the first embodiment of FIG. 2, only the surface of the semiconductor wafer 15 which corresponds to the opening region is uniformly etched while preventing the other surface region of the semiconductor wafer 15 from being affected by the etching.

Meanwhile, when the deposition gas enters the local plasma generator 23 with some reasons, the deposition gas is converted into a plasma and reacts with the etching gas in the local plasma generator 23, thereby adversely affecting the etching process. In order to prevent this, as shown in FIG. 3C, a discharge opening of the deposition gas is provided at the portion upper than the bottom of the cover 28 when seen from the surface of the semiconductor wafer 15.

Figure 4A:
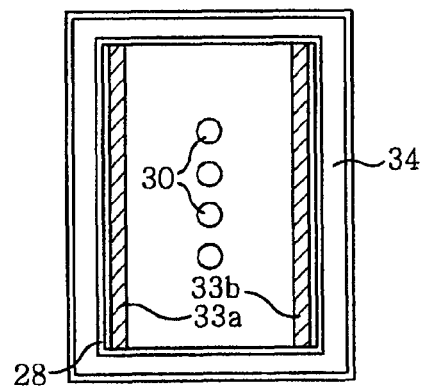
FIGS. 4A to 4C show a structure of a local plasma generator in accordance with a third embodiment of the present invention.
Figure 4B:
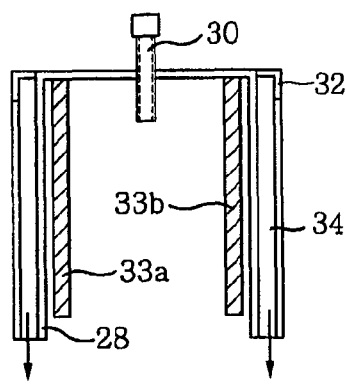
Figure 4C:
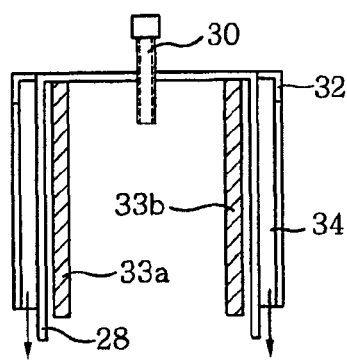
Figure 5:
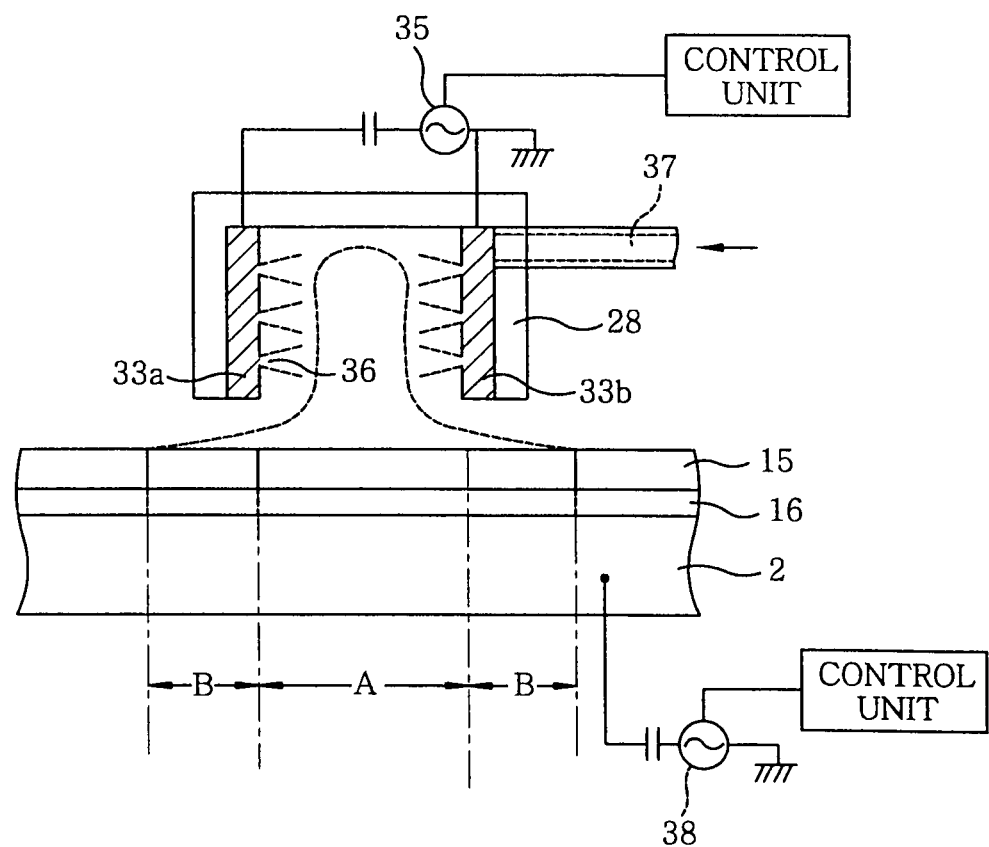
FIG. 5 shows a conventional plasma etching apparatus exemplified to explain drawbacks thereof.

FIGS. 4A to 4C depict a structure of a local plasma generator 23 in accordance with a third embodiment of the present invention. FIG. 4A is a horizontal cross sectional view; FIG. 4B is a vertical cross sectional view; and FIG. 4C is a vertical cross sectional view in which a length of the deposition gas flow channel 34 is shorter than a length of the cover 28.

The local plasma generator 23 of the third embodiment is also configured as a CCP type plasma generating device, and is the same as that of the second embodiment of FIG. 3 in that a pair of parallel plate electrodes 33a and 33b is disposed inside a rectangular box-shaped cover 28 and also in that a reactant gas (etching gas) is introduced from a plurality of reactant gas inlet lines 30 disposed at the center of the ceiling portion of the cover 28.

However, in the third embodiment, a slit-shaped deposition gas channel 34 is provided instead of the deposition gas supply lines 31. In other words, the third embodiment is characterized in that the slit-shaped deposition gas channel 34 having a substantially uniform width is formed around the outer peripheral surface of the cover 28. Moreover, the lower opening of the slit-shaped deposition gas channel 34 is extended to a height substantially same as that of the bottom of the cover 28.

The deposition gas is discharged in a curtain shape from a deposition gas supply duct 32 to the outer periphery of the opening via the deposition gas flow channel 34. Accordingly, it is possible to obtain the same effect obtained when a plurality of deposition gas supply lines 31 are provided. Further, even when the local plasma generator 23 is configured as the ICP type plasma generating unit shown in FIG. 2, the slit-shaped deposition gas channel 34 in FIG. 4 may be provided instead of the deposition gas supply lines 31.

Meanwhile, when the deposition gas enters the local plasma generator 23 with some reasons, the deposition gas is converted into a plasma and reacts with the etching gas in the local plasma generator 23, thereby adversely affecting the etching process. To that end, as shown in FIG. 4C, a discharge opening of the deposition gas is provided at the portion upper than the bottom of the cover 28 when seen from the surface of the semiconductor wafer 15.

In the present invention, types of an etching gas or a deposition gas are not limited. Generally, as for the etching gas, an F-based gas, a Cl-based gas and an $O_2$-based gas are used. The F-based gas, the Cl-based gas and the $O_2$-based gas may be used for etching an insulating film, silicon and an organic film, respectively. As for the deposition gas, a CF-based gas, a CHF-based gas and a HBr-based gas may be used.

The combination of the etching gas and the deposition gas used in the present invention is not particularly limited. In general, an F-based etching gas is preferably combined with a CHF-based deposition gas; a Cl-based etching gas is preferably combined with a CF-based or a HBr-based deposition gas; and an $O_2$-based etching gas is preferably combined with a CF-based deposition gas.

Although the deposition gas may be used as itself, it is preferably diluted with an inert gas. As for the inert gas, Ar is generally used. However, He or Xe may also be used. Preferably, the deposition gas is diluted with the inert gas at a ratio of, e.g., 1:10 to 1:50.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
    a processing chamber;
    a mounting table positioned in the processing chamber for mounting thereon a substrate to be processed;
    a local plasma generator positioned in the processing chamber, said local plasma generator including a local plasma generating chamber configured to generate a plasma therein, and an outlet which faces the mounting table such that plasma generated within the local plasma generator exits the outlet toward the mounting table to locally react on the substrate to be processed;
    a moving unit for moving the local plasma generator, wherein the local plasma generator includes an offset gas discharge mechanism positioned outside of the local plasma generating chamber and around a perimeter of the outlet, wherein the offset gas discharge mechanism is configured to discharge an offset gas along a perimeter of the outlet of the local plasma generator to localize reaction of the plasma discharged from the outlet of the local plasma generator;
    wherein a processing gas which forms the plasma is an etching gas, and the offset gas is a deposition gas; and
    wherein the deposition gas is a CHF-based deposition gas when the etching gas is a F-based etching gas, the deposition gas is a CF-based or a HBr-based deposition gas when the etching gas is a Cl-based etching gas, and the deposition gas is a CF-based deposition gas when the etching gas is a 02-based etching gas.

2. The plasma processing apparatus of claim 1, further comprising a mechanism configured to maintain a pressure in the local plasma generator to be higher than a pressure in the processing chamber.

3. The plasma processing apparatus of claim 1, wherein the local plasma generator includes a rectangular box-shaped cover positioned in the processing chamber and having the local plasma generating chamber therein, and wherein the outlet is at a bottom of the cover.

4. The plasma processing apparatus of claim 3, wherein the offset gas discharge mechanism extends in a vertical direction along a side surface of the cover.

5. The plasma processing apparatus of claim 1, wherein the local plasma generator includes a cover positioned in the processing chamber and the local plasma generating chamber is inside of said cover, and wherein the offset gas discharge mechanism is arranged outside the cover.

6. The plasma processing apparatus of claim 5, wherein the offset gas discharge mechanism includes plural gas discharge lines spaced apart from each other at regular intervals along a side surface of the cover.

7. The plasma processing apparatus of claim 6, wherein gas discharge openings of the plural gas discharge lines are provided at a position higher than a height of the outlet of the local plasma generator when seen from the substrate to be processed during plasma processing.

8. The plasma processing apparatus of claim 5, wherein the local plasma generator includes a coil for generating the plasma disposed on a top surface of the cover.

9. The plasma processing apparatus of claim 5, wherein the local plasma generator includes a pair of parallel electrodes disposed inside the cover.

10. The plasma processing apparatus of claim 5, wherein the offset gas discharge mechanism has a slit-shaped gas channel formed around a side surface of the cover.

11. The plasma processing apparatus of claim 10, wherein a gas discharge opening of the gas channel is provided at a position higher than a height of the outlet of the local plasma generator when seen from the substrate to be processed during plasma processing.

12. The plasma processing apparatus of claim 1, wherein the local plasma generator is movable in horizontal and vertical directions with respect to the substrate.

13. The plasma processing apparatus of claim 1, wherein the offset gas comprises a deposition gas and an inert gas including an Ar, He or Xe gas.

14. A plasma processing method for plasma processing an entire surface of a substrate to be processed by repeatedly performing a process for allowing a plasma of a processing gas to locally react on the substrate until the entire surface of the substrate is processed by the plasma with the use of a local plasma generator disposed to face a mounting table for mounting thereon the substrate to be processed in an airtight processing chamber, wherein the local plasma generator is disposed within the processing chamber and includes a local plasma generating chamber which is configured to generate a plasma therein, and an outlet facing the mounting table, the method comprising:

generating a plasma within the local plasma generating chamber of the local plasma generator within the processing chamber, and flowing the plasma out of the outlet of the local plasma generator toward a substrate on the mounting table;

discharging an offset gas along a perimeter of the outlet of the local plasma generator, which localizes reaction of the plasma, to a boundary region which surrounds a region through which the plasma is discharged from the outlet of the local plasma generator into the processing chamber and toward the substrate;

wherein a processing gas which forms the plasma is an etching gas, and the offset gas is a deposition gas; and wherein the deposition gas is a CHF-based deposition gas when the etching gas is a F-based etching gas, the deposition gas is a CF-based or a HBr-based deposition gas when the etching gas is a Cl-based etching gas, and the deposition gas is a CF-based deposition gas when the etching gas is a 02-based etching gas.

15. The plasma processing method of claim 14, wherein the plasma processing is performed while maintaining a pressure in the local plasma generator to be higher than a pressure in the processing chamber.

16. The plasma processing method of claim 14, wherein the offset gas is discharged from an offset gas discharge mechanism, and wherein the local plasma generator includes a cover positioned inside of the processing chamber and the local plasma generating chamber is inside of the cover and wherein the offset gas discharge mechanism is arranged outside the cover.

* * * * *

UNITED STATES PATENT AND TRADEMARK OFFICE
CERTIFICATE OF CORRECTION

PATENT NO.        : 8,558,134 B2                                Page 1 of 1
APPLICATION NO.   : 12/410672
DATED             : October 15, 2013
INVENTOR(S)       : Yusuke Hirayama It is certified that error appears in the above-identified patent and that said Letters Patent is hereby corrected as shown below:

In the Claims:

Column 8, Line 17, Claim 1: "etching gas is a O2-based etching gas." should read --etching gas is a $O_2$-based etching gas.--

Column 10, Line 6, Claim 14: "etching gas is a O2-based etching gas." should read --etching gas is a $O_2$-based etching gas.--

Signed and Sealed this
Tenth Day of December, 2013

Margaret A. Focarino
*Commissioner for Patents of the United States Patent and Trademark Office*